US011121526B2

(12) United States Patent
Lochman et al.

(10) Patent No.: US 11,121,526 B2
(45) Date of Patent: Sep. 14, 2021

(54) EXCHANGEABLE LASER RESONATOR MODULES WITH ANGULAR ADJUSTMENT

(71) Applicant: PANASONIC INTELLECTUAL PROPERTY MANAGEMENT CO. LTD, Osaka (JP)

(72) Inventors: Bryan Lochman, Somerville, MA (US); Matthew Sauter, Boston, MA (US); Bien Chann, Merrimack, NH (US); Wang-Long Zhou, Andover, MA (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 28 days.

(21) Appl. No.: 16/421,728

(22) Filed: May 24, 2019

(65) Prior Publication Data

US 2019/0363519 A1 Nov. 28, 2019

Related U.S. Application Data

(60) Provisional application No. 62/676,041, filed on May 24, 2018.

(51) Int. Cl.
*H01S 5/40* (2006.01)
*H01S 5/14* (2006.01)
(Continued)

(52) U.S. Cl.
CPC ............ *H01S 5/4012* (2013.01); *H01S 3/086* (2013.01); *H01S 5/0225* (2021.01); *H01S 5/14* (2013.01); *H01S 5/4062* (2013.01); *H01S 5/4087* (2013.01)

(58) Field of Classification Search
CPC ............. H01S 3/08004; H01S 3/08054; H01S 3/136–137; H01S 3/086; H01S 3/101;
(Continued)

(56) References Cited

U.S. PATENT DOCUMENTS 3,358,243 A * 12/1967 Collins, Jr. ............. H01S 3/093
372/19
3,478,608 A * 11/1969 Met ...................... G02B 7/1825
74/89.23
(Continued)

FOREIGN PATENT DOCUMENTS

CN 106950707 7/2017
DE 102012000038 A1 * 7/2013 ............. B82Y 20/00
(Continued)

OTHER PUBLICATIONS

International Search Report for corresponding International Application No. PCT/IB2019/000650, dated Nov. 15, 2019, 3 pages.

*Primary Examiner* — Joshua King
(74) *Attorney, Agent, or Firm* — Morgan, Lewis & Bockius, LLP

(57) ABSTRACT

In various embodiments, emitter modules include a laser source and (a) a refractive optic, (b) an output coupler, or (c) both a refractive optic and an output coupler. Either or both of these may be situated on mounts that facilitate two-axis rotation. The mount may be, for example, a conventional, rotatively adjustable "tip/tilt" mount or gimbal arrangement. In the case of the refractive optic, either the optic itself or the beam path may be adjusted; that is, the optic may be on a tip/tilt mount or the optic may be replaced with two or more mirrors each on tip/tilt mount.

17 Claims, 3 Drawing Sheets

(51) Int. Cl.
*H01S 3/086* (2006.01)
*H01S 5/0225* (2021.01)

(58) Field of Classification Search
CPC ........... H01S 3/105–1055; H01S 3/139; H01S 5/14–148; H01S 5/4012; H01S 5/02288–02296; H01S 5/06243; H01S 5/4062
See application file for complete search history.

(56) References Cited

U.S. PATENT DOCUMENTS

| | | | | |
|---|---|---|---|---|
| 3,718,868 A * | 2/1973 | Pao | ........................ | H01S 3/086 372/32 |
| 4,283,116 A * | 8/1981 | Weis | ...................... | B01D 59/34 359/204.1 |
| 4,461,006 A * | 7/1984 | Salour | ............... | H01S 3/094026 372/35 |
| 4,462,103 A * | 7/1984 | Salour | ................... | H01S 5/0222 372/20 |
| 4,477,730 A * | 10/1984 | Fukuda | ................. | H01S 5/4025 250/347 |
| 4,664,487 A * | 5/1987 | Tam | ...................... | G02B 7/1821 359/874 |
| 4,672,626 A * | 6/1987 | Koseki | .................... | H01S 3/086 359/874 |
| 4,775,211 A * | 10/1988 | Wondrazek | ............... | G02B 6/32 385/88 |
| 4,919,532 A * | 4/1990 | Mocker | .................. | G01S 7/499 356/28.5 |
| 4,922,501 A * | 5/1990 | Wolgast | ............ | H01S 3/094034 372/15 |
| 4,942,583 A * | 7/1990 | Nazarathy | ............... | H01S 5/141 372/102 |
| 4,955,028 A * | 9/1990 | Alferness | ........... | G02B 6/02061 372/102 |
| 5,111,476 A * | 5/1992 | Hollenbeck | .......... | G02B 6/4226 372/107 |
| 5,172,390 A * | 12/1992 | Mooradian | .......... | G02B 6/4204 372/50.11 |
| 5,197,076 A * | 3/1993 | Davis | ................... | H01S 5/024 372/29.02 |
| 5,216,729 A * | 6/1993 | Berger | .................. | G02B 6/4212 385/31 |
| 5,291,571 A * | 3/1994 | Kunikane | ................ | G02B 6/34 359/489.09 |
| 5,383,199 A * | 1/1995 | Laudenslager | ........ | A61B 18/20 372/25 |
| 5,434,874 A * | 7/1995 | Fouquet | .................. | H01S 3/105 372/20 |
| 5,594,543 A * | 1/1997 | de Groot | .............. | G01S 7/4811 356/5.09 |
| 5,610,930 A * | 3/1997 | Macomber | .......... | H01S 5/4025 372/109 |
| 5,663,980 A * | 9/1997 | Adachi | ............... | H01S 5/02296 372/103 |
| 5,872,803 A * | 2/1999 | Mori | ....................... | H01S 3/025 372/75 |
| 6,097,749 A * | 8/2000 | Naoe | ........................ | G02B 5/22 372/101 |
| 6,108,355 A * | 8/2000 | Zorabedian | ............. | H01S 5/141 372/107 |
| 6,233,268 B1 * | 5/2001 | Naito | ....................... | H01S 3/139 372/107 |
| 6,614,601 B2 * | 9/2003 | Dallakian | ............. | G02B 7/1824 359/804 |
| 6,876,679 B1 * | 4/2005 | Bowler | .................. | G02B 6/29365 372/101 |
| 7,565,084 B1 * | 7/2009 | Wach | ................... | H04B 10/506 398/183 |
| 7,839,904 B1 * | 11/2010 | Equall | ................... | H01S 3/1083 372/10 |
| 8,537,865 B1 * | 9/2013 | Shou | ................ | H01S 3/094003 372/6 |
| 9,086,375 B2 * | 7/2015 | Priest | ..................... | G02B 27/10 |
| 9,212,990 B1 * | 12/2015 | Muraviev | ................. | G01J 3/26 |
| 9,889,524 B2 | 2/2018 | Tayebati et al. | | |
| 9,972,975 B2 | 5/2018 | Tayebati et al. | | |
| 10,505,336 B2 * | 12/2019 | Narumi | ................ | H01S 3/0405 |
| 2002/0064192 A1 * | 5/2002 | Missey | ............... | G02B 26/0816 372/20 |
| 2003/0052960 A1 * | 3/2003 | Okazaki | ..................... | B41J 2/45 347/238 |
| 2004/0068254 A1 * | 4/2004 | Hayashi | .................. | H01S 3/081 606/4 |
| 2004/0165639 A1 * | 8/2004 | Lang | ....................... | H01S 5/141 372/92 |
| 2005/0207457 A1 * | 9/2005 | Agnesi | .................. | H01S 3/0602 372/27 |
| 2005/0254532 A1 * | 11/2005 | Van Saarloos | ..... | G02B 26/0875 372/24 |
| 2006/0085992 A1 * | 4/2006 | Monty | ................. | G01C 15/002 33/286 |
| 2006/0092993 A1 * | 5/2006 | Frankel | ................. | H01S 5/4062 372/18 |
| 2006/0182154 A1 * | 8/2006 | Tanaka | .................... | H01S 3/139 372/9 |
| 2006/0215725 A1 * | 9/2006 | Wiessner | ................ | H01S 3/005 372/107 |
| 2006/0280221 A1 * | 12/2006 | Seitel | ........................ | H01S 3/08 372/100 |
| 2007/0019907 A1 * | 1/2007 | Alcock | ................... | G02B 7/021 385/33 |
| 2007/0025401 A1 * | 2/2007 | Hayashi | ................... | G02F 1/37 372/22 |
| 2007/0098028 A1 * | 5/2007 | Alcock | ..................... | H01S 5/40 372/29.015 |
| 2007/0115617 A1 * | 5/2007 | Schulte | ................. | H01S 5/4025 361/671 |
| 2008/0019011 A1 * | 1/2008 | Krneta | ............... | G02B 19/0052 359/641 |
| 2008/0212108 A1 * | 9/2008 | Shibatani | ............ | G02B 6/4227 356/614 |
| 2008/0240184 A1 * | 10/2008 | Cho | ...................... | B23K 26/043 372/38.01 |
| 2008/0243272 A1 * | 10/2008 | Shibatani | ............ | G02B 6/4226 700/59 |
| 2009/0022188 A1 * | 1/2009 | Almoric | ................ | H01S 5/0622 372/22 |
| 2009/0027753 A1 * | 1/2009 | Lizotte | .................... | H01S 3/005 359/238 |
| 2009/0080476 A1 * | 3/2009 | Partlo | ................. | G03F 7/70583 372/25 |
| 2009/0116519 A1 * | 5/2009 | Redford | ................ | H01S 3/2383 372/29.014 |
| 2009/0213350 A1 * | 8/2009 | Sogard | .................... | G03B 27/54 355/67 |
| 2010/0302514 A1 * | 12/2010 | Silverstein | ........... | G02B 27/149 353/37 |
| 2011/0038026 A1 * | 2/2011 | Skliar | ....................... | H01S 3/127 359/257 |
| 2011/0096543 A1 * | 4/2011 | Yabe | ......................... | H01S 5/005 362/235 |
| 2012/0027035 A1 | 2/2012 | Volodin | | |
| 2012/0105968 A1 * | 5/2012 | Chann | ................... | G02B 19/0057 359/634 |
| 2012/0106160 A1 * | 5/2012 | Pushkarsky | ............ | H01S 5/4025 362/259 |
| 2012/0250709 A1 * | 10/2012 | Watanabe | ............. | H01S 3/0057 372/25 |
| 2013/0163629 A1 * | 6/2013 | Lee | ......................... | H01S 5/141 372/44.01 |
| 2013/0256516 A1 * | 10/2013 | Mochizuki | ................ | H01S 5/02 250/226 |
| 2014/0185634 A1 * | 7/2014 | Ichihara | ................. | H01S 3/082 372/10 |
| 2015/0070774 A1 * | 3/2015 | Kadoya | ................. | G02B 26/002 359/634 |

(56) References Cited

U.S. PATENT DOCUMENTS

| | | | |
|---|---|---|---|
| 2015/0241632 A1* | 8/2015 | Chann | G02B 6/2848 |
| | | | 385/27 |
| 2015/0331205 A1* | 11/2015 | Tayebati | G02B 6/2706 |
| | | | 385/27 |
| 2016/0048028 A1 | 2/2016 | Deutsch et al. | |
| 2016/0076944 A1* | 3/2016 | Moriya | H01S 3/134 |
| | | | 356/364 |
| 2016/0248222 A1* | 8/2016 | Miyata | H01S 5/0264 |
| 2016/0344162 A1* | 11/2016 | Konno | C03B 23/20 |
| 2017/0052381 A1* | 2/2017 | Huang | B23K 26/073 |
| 2017/0201062 A1* | 7/2017 | Nettleton | H01S 3/123 |
| 2017/0288367 A1* | 10/2017 | Taniguchi | H01S 5/4075 |
| 2017/0293084 A1 | 10/2017 | Zhou et al. | |
| 2017/0310071 A1* | 10/2017 | Xie | H01S 3/0815 |
| 2017/0368638 A1 | 12/2017 | Tayebati et al. | |
| 2018/0013263 A1* | 1/2018 | Sakamoto | H01S 5/4025 |
| 2018/0026425 A1* | 1/2018 | Usuda | H01S 5/0612 |
| | | | 372/32 |
| 2019/0011100 A1* | 1/2019 | Son | B60Q 1/143 |
| 2019/0207357 A1* | 7/2019 | Cheng | F21V 5/04 |
| 2019/0280458 A1* | 9/2019 | Dykaar | H01S 5/0014 |
| 2019/0305517 A1* | 10/2019 | Dejima | H01S 5/4087 |
| 2019/0372311 A1* | 12/2019 | Dejima | H01S 5/06255 |
| 2020/0021075 A1* | 1/2020 | Cho | H01S 3/0085 |
| 2020/0028312 A1* | 1/2020 | Monroe | H01S 3/06725 |
| 2020/0067281 A1* | 2/2020 | Curwen | H01S 5/423 |

FOREIGN PATENT DOCUMENTS

| | | | | |
|---|---|---|---|---|
| JP | 03241883 A | * | 10/1991 | H01S 3/1055 |
| KR | 20130093704 A | * | 8/2013 | H01S 5/141 |
| WO | WO-0201686 A1 | * | 1/2002 | G02B 26/0808 |

* cited by examiner

EXCHANGEABLE LASER RESONATOR MODULES WITH ANGULAR ADJUSTMENT

RELATED APPLICATIONS

This application claims the benefit of and priority to U.S. Provisional Patent Application No. 62/676,041, filed May 24, 2018, the entire disclosure of which is hereby incorporated herein by reference.

TECHNICAL FIELD

In various embodiments, the present invention relates to laser systems, specifically high-power laser systems with exchangeable resonators.

BACKGROUND

High-power laser systems are utilized for many industrial applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common, partially reflecting output coupler that is filtered by the dispersive element along a beam-combining dimension. Exemplary WBC systems are detailed in U.S. Pat. Nos. 6,192,062, 6,208,679, 8,670,180, and 8,559,107, the entire disclosure of each of which is incorporated by reference herein.

In some multi-emitter configurations, the individual emitters may be removed and replaced separately. For example, a high-power laser system may feature multiple individually replaceable emitter modules each containing at least one laser source, e.g., one or more diode-based sources. The emitter modules may be removed from the system and replaced "in the field" by the end user. But replacement of an emitter module requires proper alignment of the new module. Most high-power laser systems are used in unclean environments, which are unsuitable for laser alignment. Hence, if alignment in the field is impractical, it must be ensured, within a tolerance level, during manufacture of the emitter modules. That can be challenging, but if the variation in beam pointing and beam position between laser resonators can be reduced below a critical level, emitter modules will be exchangeable in the combining system without further adjustment.

SUMMARY

Emitter modules, also referred to as laser source or resonator modules, in accordance with embodiments of the invention may include electrical and optical interfaces that mate with complementary features on a beam-combining enclosure in which the individual beams from the modules are combined into a single output beam (and, in some embodiments, coupled into an optical fiber). These optical and electrical interfaces facilitate the easy replacement of input laser sources with a minimal amount of, if any, source alignment. The emitter modules may be insertable into, and mate with, input receptacles disposed in or on the enclosure in which the input beams are combined to form the output beam.

Emitter modules include a laser source and (a) a refractive optic, (b) an output coupler, or (c) both a refractive optic and an output coupler. Either or both of these may be situated on mounts that facilitate two-axis rotation. The mount may be, for example, a conventional, rotatively adjustable "tip/tilt" mount or gimbal arrangement. In the case of the refractive optic, either the optic itself or the beam path may be adjusted; that is, the optic may be on a tip/tilt mount or the optic may be replaced with a pair of mirrors each on tip/tilt mount. In various embodiments, the output coupler is partially reflective, facilitating emission of a portion of the output beam from the emitter module and reflection of another portion of the output beam back to the original beam emitter(s) to thereby generate external-cavity emission within the emitter module.

Output beams produced in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention may also process workpieces at one or more spots or along a one-dimensional linear or curvilinear processing path, rather than flooding all or substantially all of the workpiece surface with radiation from the laser beam. Such one-dimensional paths may be composed of multiple segments, each of which may be linear or curvilinear.

Accordingly, in a first aspect, the invention pertains to an emitter module for use with a laser system for combining a plurality of input beams into a combined output beam. In various embodiments, the emitter module has a forward face and comprises a laser beam source, an output coupler, and means for removably but securely coupling the emitter module to the laser system, wherein the output coupler is rotatively adjustable about a pair of perpendicular coordinate axes parallel to the forward face. In some embodiments, the emitter module further includes a refractive optic for receiving and directing the laser beam, wherein the refractive optic and/or the output coupler is rotatively adjustable about a pair of perpendicular coordinate axes parallel to the forward face. For example, the refractive optic and/or the output coupler may be rotatively adjustable on a tip/tilt mount. Alternatively, the laser beam may pass through the refractive optic along a beam path, and the beam path may be adjustable about the perpendicular coordinate axes by a pair of mirrors.

In another aspect, the invention pertains to an emitter module for use with a laser system for combining a plurality of input beams into a combined output beam. In various embodiments, the emitter module has a forward face and comprises a laser beam source, a refractive optic for receiving and directing the laser beam, an output coupler, and means for removably but securely coupling the emitter module to the laser system, wherein the refractive optic and/or the output coupler is rotatively adjustable about a pair of perpendicular coordinate axes parallel to the forward face.

In still another aspect, the invention pertains to a laser delivery system for directing optical radiation onto a workpiece. In various embodiments, the system comprises a plurality of emitter modules each having a forward face and producing an input beam, where the emitter modules each comprise an output coupler; means for removably but securely coupling each of the emitter modules to the laser delivery system; and beam-combining optics for receiving the input beams from the emitters and producing an output beam therefrom. In each of the emitter modules, the output coupler is rotatively adjustable about a pair of perpendicular coordinate axes parallel to the forward face of the emitter module.

In various embodiments, each emitter module further comprises a refractive optic for receiving and directing the input beam, and the refractive optic and/or the output coupler is rotatively adjustable about a pair of perpendicular coordinate axes parallel to the forward face of the associated emitter module. For example, the refractive optic and/or the output coupler may be rotatively adjustable on a tip/tilt mount. Alternatively, the input beam of each emitter module may pass through the associated refractive optic along a beam path, which is adjustable about the perpendicular coordinate axes by a pair of mirrors.

In some embodiments, laser delivery system further comprises a controller for adjusting an angular position of at least one of the refractive optic or the output coupler. The system may further include a sensor for sensing a parameter of the output beam, with the controller being responsive to the sensor and adjusting, based on signals therefrom, the angular position of at least one of the refractive optic or the output coupler. The signals may be indicative of at least one beam parameter, e.g., a beam shape, a spot size and/or a numerical aperture. The controller may be configured to continue adjusting the angular position until a target value of the at least one beam parameter is attained.

In various embodiments, the laser delivery system further comprises focusing optics for focusing the input beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element; the radiation beam is composed of multiple wavelengths.

Yet another aspect of the invention pertains to a method of processing a workpiece with a laser system comprising a plurality of emitter modules each having a forward face and producing an input beam, where each of the emitter modules comprises an output coupler and, optionally, a refractive optic for receiving and directing the input beam. In various embodiments, the method comprises the steps of combining the input beams from the emitters in an output beam, rotatively adjusting the output coupler of each of the emitter modules about a pair of perpendicular coordinate axes parallel to the forward face of the emitter module until the output beam exhibits a target value of a beam parameter, and processing the workpiece using the output beam.

In various embodiments, the emitter modules each comprise a refractive optic and an output coupler. The beam parameter may be a beam shape, a spot size or a numerical aperture. The refractive optic and/or the output coupler of each of the emitter modules may be rotatively adjustable, e.g., on a tip/tilt mount. In some embodiments, the input beam of each emitter module passes through the associated refractive optic along a beam path, which is adjustable about the perpendicular coordinate axes by a pair of mirrors.

As used herein, the terms "approximately," "about," "roughly," and "substantially" mean ±10%, and in some embodiments, ±5%. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. "Distances" utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figures 1A, 1B:
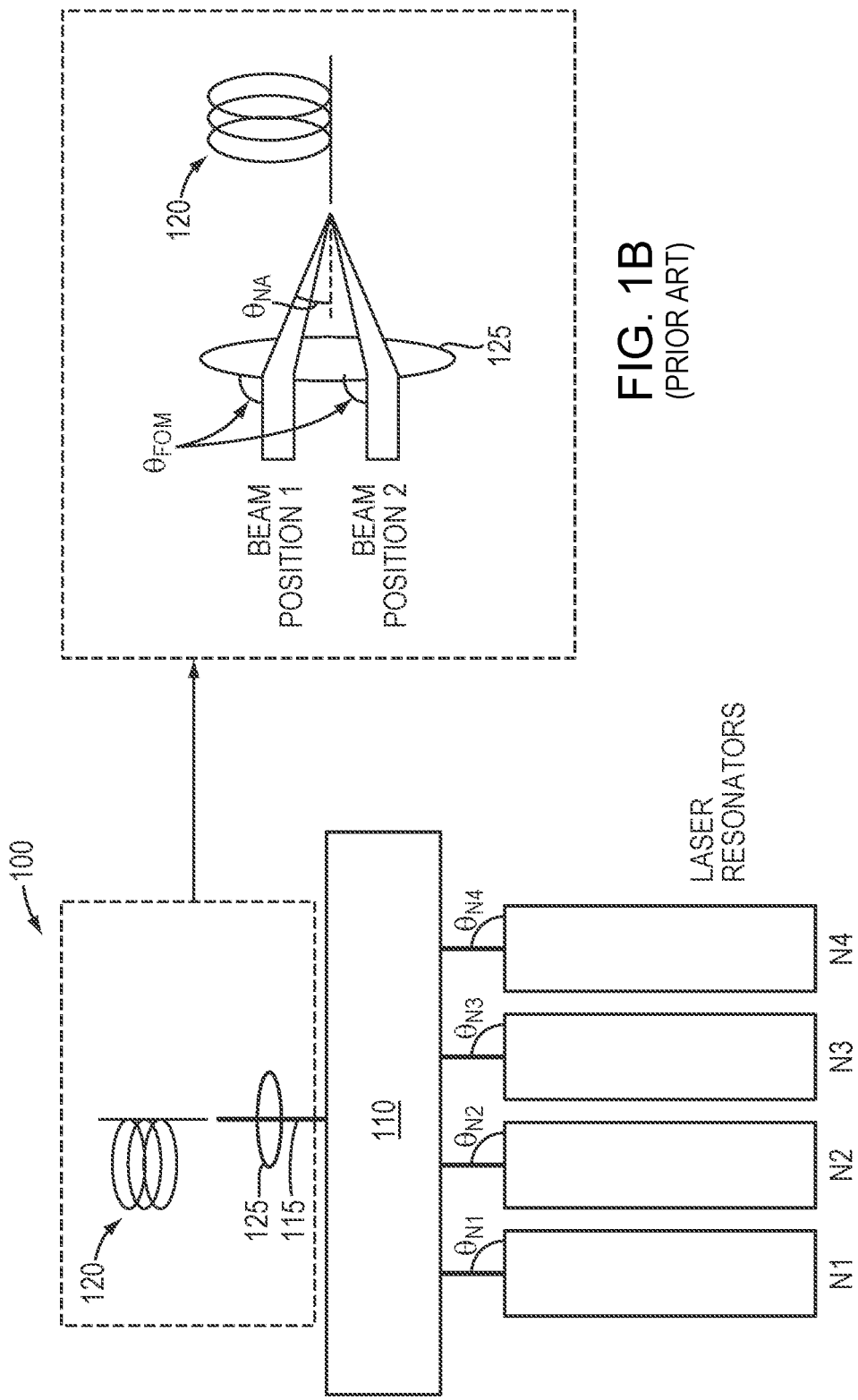
FIG. 1A is a schematic plan view of a conventional array of laser resonators and associated optics.
FIG. 1B is an enlarged schematic depiction of the fiber-optic module shown in FIG. 1A, illustrating certain beam angles relevant to embodiments of the invention.

Laser devices in accordance with embodiments of the present invention may be utilized in WBC systems to form high-brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by π. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

Materials characterized herein as exhibiting a high thermal conductivity, or as "thermally conductive materials," have a thermal conductivity of at least 100 watts per meter per Kelvin ($W \cdot m^{-1} \cdot K^{-1}$), at least 170 $W \cdot m^{-1} \cdot K^{-1}$, or even at least 300 $W \cdot m^{-1} \cdot K^{-1}$. Materials characterized herein as exhibiting a high electrical conductivity, or as "electrically conductive materials," have an electrical conductivity, e.g., at 20° C., of at least $1 \times 10^5$ siemens per meter (S/m), at least $1 \times 10^6$ S/m, or even at least $1 \times 10^7$ S/m. Materials characterized herein as exhibiting a high electrical resistivity, or as "electrically insulating materials," have an electrical resistivity of at least $1 \times 10^8$ ohmmeter (Ω·m), at least $1 \times 10^{10}$ Ω·m, or even at least $1 \times 10^{12}$ Ω·m.

As known to those of skill in the art, lasers are generally defined as devices that generate visible or invisible light through stimulated emission. Lasers generally have properties that make them useful in a variety of applications, as mentioned above. Common laser types include semiconductor lasers (e.g., laser diodes and diode bars), solid-state lasers, fiber lasers, and gas lasers. A laser diode is generally based on a simple diode structure that supports the emission of photons (light). However, to improve efficiency, power, beam quality, brightness, tunability, and the like, this simple structure is generally modified to provide many practical types of laser diodes. Laser diode types include small edge-emitting varieties that generate from a few milliwatts up to roughly half a watt of output power in a beam with high beam quality. Structural types of diode lasers include double hetero-structure lasers that feature a layer of low-bandgap material sandwiched between two high-bandgap layers; quantum well lasers that include a very thin middle (quantum well) layer resulting in high efficiency and quantization of the laser's energy; multiple quantum well lasers that include more than one quantum well layer to improve gain characteristics; quantum wire or quantum sea (dots) lasers that replace the middle layer with a wire or dots to produce higher-efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting lasers (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multimode diodes with oblong output facets and generally have poor beam quality but generate a few watts of power; tapered lasers that are characterized by astigmatic mode diodes with tapered output facets that exhibit improved beam quality and brightness when compared to broad-area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with a nearly circular profile.

A diode-laser bar is a type of semiconductor laser containing a one-dimensional array of broad-area emitters or alternatively containing subarrays containing, e.g., 10-20 narrow-stripe emitters. A broad-area diode bar typically contains, for example, 19-49 emitters, each having dimensions on the order of, e.g., 1 μm×100 μm. The beam quality along the 1 μm dimension or fast axis is typically diffraction-limited. The beam quality along the 100 μm dimension or slow axis (the array dimension) is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

Embodiments of the present invention couple output beams (which may be multi-wavelength output beams) into an optical fiber. In various embodiments, the optical fiber has multiple cladding layers surrounding a single core, multiple discrete core regions (or "cores") within a single cladding layer, or multiple cores surrounded by multiple cladding layers. In various embodiments, the output beams may be delivered to a workpiece for applications such as cutting, welding, etc.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The beams utilized in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

The environment of the invention is illustrated in FIGS. 1A and 1B. A high-power laser-delivery system 100 includes a plurality of laser resonator (emitter) modules $N_1$-$N_4$, produce output that is combined into a single (e.g., multi-wavelength) output beam or a plurality of beams via combining optics 110. (It should be understood, of course, that commercial systems may have any number of resonators N; four are illustrated as an example.) The output of each emitter $N_1$-$N_4$ leaves the emitter at an angle $\theta_{N1} \ldots \theta_{N4}$, which is desirably substantially perpendicular to the emitter's output facet. Multiple beams are spatially stacked, effectively forming a single beam with a fill factor, and the combining optics 110 can combine in terms of polarization, wavelength (coarse dichroic) or spatial stacking. The output beam 115, in turn, may be coupled into an optical fiber 120 in a fiber-optic module (FOM) by means of a focusing lens or lens assembly ("FOM lens") 125. Once in-coupled into the optical fiber 120, the output beam 115 may be utilized to process (e.g., cut, weld, anneal, drill, etc.) a workpiece. FIG. 1B illustrates spatially separate beams striking the FOM lens 125. If $\theta_{N1} \ldots \theta_{N4}$ are perpendicular to the emitter output facets and the emitters $N_1$-$N_4$ are fully parallel, the beams all strike the FOM lens 125 at a consistent angle $\theta_{FOM}$.

The combining optics 110 may optionally include one or more refractive optical elements. If included, the refractive optical element(s) (herein referred to generically as the "refractive optic") may comprise, consist essentially of, or consist of one or more cylindrical or spherical lenses, flat optics, wedges and/or mirrors. The refractive optical element(s) combine each beam along a wavelength beam combining (WBC) direction. Proper operation of the system requires optical alignment of the beams from the laser resonator modules $N_1$-$N_4$ as they enter the combining optics 110.

The beam-combining optics 110 may include a gain medium for the formation and/or enhancement of optical gain for each of the beams emitted from the emitter modules $N_1 \ldots N_4$. The gain medium may include, consist essentially of, or consist of one or more materials which, when excited by the beam(s) from the emitter modules, undergoes stimulated emission. For example, the gain medium may include, consist essentially of, or consist of one or more crystals and/or glasses doped with one or more ions (e.g., rare-earth ions such as neodymium, ytterbium, or erbium or transition metal ions such as titanium or chromium), e.g., yttrium aluminum garnet ($Y_3Al_5O_{12}$), yttrium orthovanadate ($YVO_4$), sapphire ($Al_2O_3$), or cesium cadmium bromide ($CsCdBr_3$). Example gain media include Nd:YAG (neodymium-doped yttrium aluminum garnet), Yb:YAG (ytterbium-doped YAG), Yb:glass, Er:YAG (erbium-doped YAG), or Ti:sapphire used in the form of solid pieces or optical glass fibers.

Figure 2:
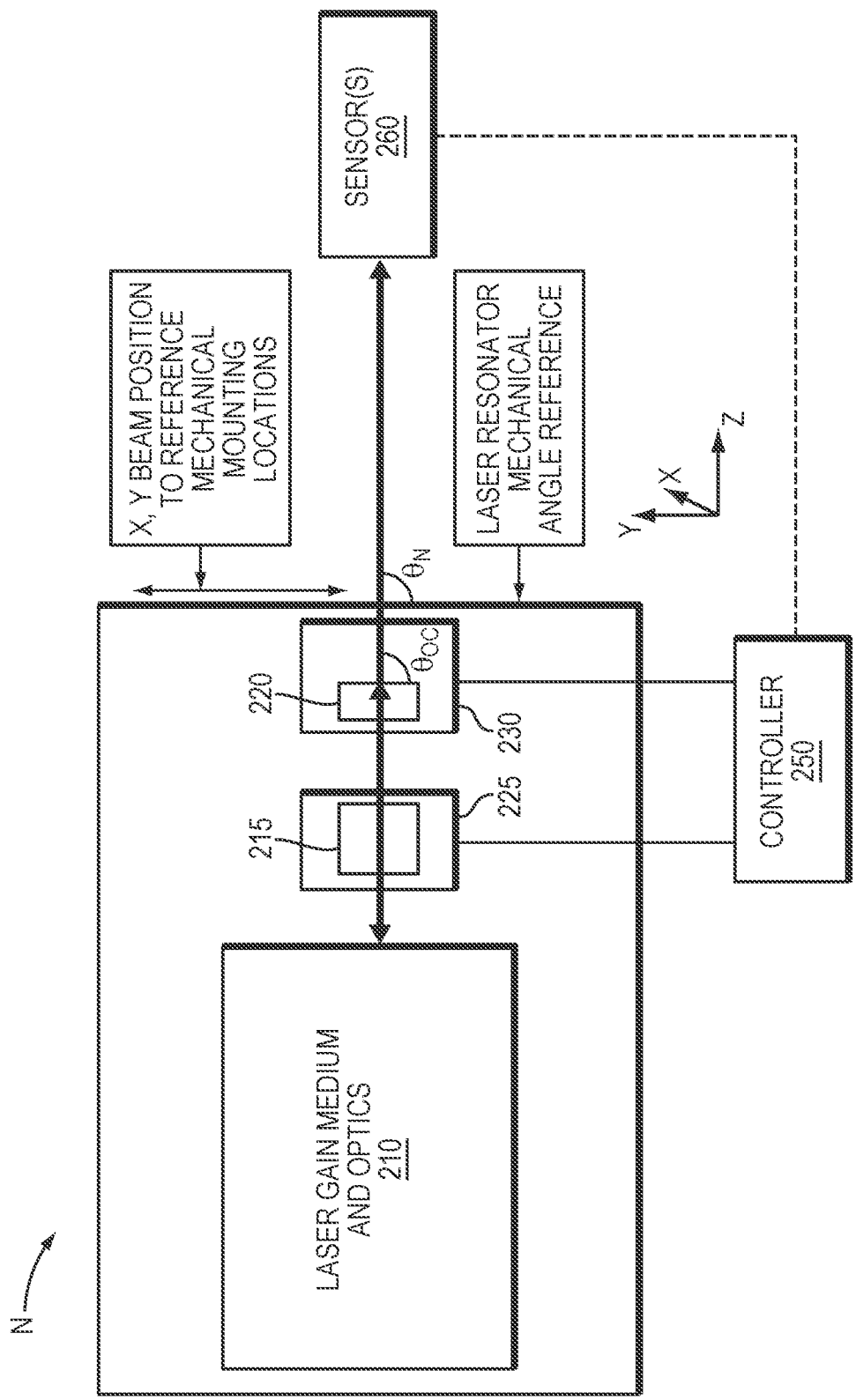
FIG. 2 is a schematic plan view of a laser resonator unit in accordance with embodiments of the invention.

FIG. 2 illustrates the architecture of a representative laser resonator (emitter) module N. A laser source 210 includes a conventional laser gain medium and output optics (e.g., one or more collimators). The output beam passes through an optional refractive optic 215 and an output coupler 220, which transmits the combined output beam. The output coupler 220 is typically partially reflective and, if not included within the resonator package N, can act as a common front facet for all the resonator elements. The output beam emerges from the output coupler 220 and an angle hoc with respect thereto, and from the resonator N at an angle θN with respect to the mechanical reference plane of the resonator itself. That is, even if mechanical alignment between the resonators and the combining optics is strictly enforced, the beams themselves can follow a path that is not perfectly perpendicular to the mechanical reference plane. Consequently, ON must be perpendicular within a certain tolerance, so that the angle of the beam entering the FOM lens 125 ($\theta_{FOM}$) does not cause the beam to move off of the fiber 120 and thereby reduce the coupling efficiency to an unacceptable degree.

In the illustrated embodiment, both the refractive optic 215 and the output coupler 220 are situated on respective mounts 225, 230 that facilitate rotation about the illustrated x axis, $\theta_X$, and rotation about the y axis, $\theta_Y$. The mounts 225, 230 may be, for example, conventional, rotatively adjustable "tip/tilt" mounts and/or conventional gimbal arrangements. In the case of the refractive optic 215, either the optic itself or the beam path may be adjusted; that is, the optic 215 may be on a tip/tilt mount or the optic may be replaced with a pair of (or more) mirrors each on tip/tilt mount. In some embodiments, only one of refractive optic 215 or the output coupler 220 is rotatively adjustable, and the other is fixedly mounted.

Adjustments to the mounts 225, 230 may be performed in the factory to preset the resonator module N to be within a certain margin for beam angle and position relative to the other resonators. As described in greater detail below, in various embodiments, the resonator modules may be pinned (mechanically set) into the combiner module within a certain margin for angle and position. So long as this margin is met, there is no need for optical adjustment in the field after removing an old laser resonator module and installing a new one. That is, in accordance with embodiments of the invention, adjustment of the output beam angle and position may be achieved solely via adjustment of the refractive optic 215 and/or the output coupler 220, rather than by adjustment of the position or angle of resonator module N itself.

These adjustments control the output beam angle, $\theta_{OC}$, relative to the output coupler 220 because the beam will always form an optimal lasing resonator cavity when $\theta_{OC}=90°$, and ensure that the deviation ON of the beam from perpendicularity relative to the x and y axes (i.e., relative to the mechanical reference plane of the emitter module N) is within an acceptable tolerance level. The beam position relative to the FOM lens determines both the numerical aperture, $\theta_{N4}$, of the beam (see FIG. 1B) and its coupling efficiency into the fiber 120, and hence, the tolerance level or margin corresponds to a commercially acceptable deviation for a given application. The illustrated arrangement allows virtually any desired margin to be achieved without undue experimentation, so long as the rotatable mount(s) is/are capable of sufficiently fine adjustment. It should also be noted that although omission of the refractive optic 215 would result in some degradation of the numerical aperture of the output beam, the coupling efficiency would remain high because $\theta_{OC}$ would still set the proper angle for the FOM lens. This is especially true in the case of high-power resonators where exact beam position may be less critical.

The mechanical interface between the replaceable emitter module N and the retaining enclosure or support is not critical; one arrangement is described in U.S. Ser. No. 15/660,134, filed on Jul. 26, 2017, the entire disclosure of which is hereby incorporated by reference. For example, as described therein, each emitter module N may connect mechanically, electrically, and optically with one of multiple input receptacles disposed in or on (or forming portions of) the enclosure for the beam-combining optics 110. Electrical connections between the resonator modules N and the beam-combining enclosure may be facilitated via an electrical interface disposed on the emitter housing that electrically connects to a complementary electrical output within an input receptacle on the beam-combining optics enclosure when the emitter module is received therein. For example, the emitter module electrical interface and the electrical output may include, consist essentially of, or consist of wires, oppositely polarized (i.e., male and female) electrical connectors, bump bonds, or other electrically conductive structures. Each emitter module N may also include an optical interface (e.g., one or more optical elements, lenses, prisms, and/or windows) through which the focused input beam is transmitted to the beam-combining optics 110. Mechanical alignment of each of the emitter modules N to the input receptacles of the beam-combining enclosure may be facilitated by alignment features (e.g., sockets, protrusions, fasteners, clasps, etc.) shaped to receive and secure (e.g., latch or compressively retain) the emitter module in an orientation in which optical and electrical interconnection of the emitter module N and beam-combining optics enclosure result. Each input receptacle may also include an optical receiver (e.g., one or more optical elements, lenses, prisms, and/or windows) that receives the input beam from the emitter module when the latter is connected to the input receptacle. In various embodiments, the use of input receptacles obviates the need to utilize optical fiber or other separate connectors between the emitter modules (and/or the beam sources therein) and the beam-combining optics enclosure.

The rotatable mounts 225 and/or 230 may be adjusted manually or, in some embodiments, may be responsive to a controller 250 via, e.g., associated stepper motors (not shown). The controller 250 may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680x0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described above. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as PYTHON, FORTRAN, PASCAL, JAVA, C, C++, C #, BASIC, various scripting languages, and/or HTML. Additionally, the software may be implemented in an assembly language directed to the microprocessor resident on a target computer; for example, the software may be implemented in Intel 80x86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

In various embodiments, as the controller 250 causes movement of one or both mounts 225, 230, one or more parameters of the output beam may be continuously sensed and the measurement(s) used as feedback so that the optimal rotational positions of the mounts 225, 230 are progressively attained. For example, a photodetector or other light sensor 260 may be utilized to monitor the beam shape, beam diameter, NA, and/or flux density at the workpiece surface (for example, the beam property of the beam itself, or via measurement of a reflection from the workpiece surface), and the controller 250 may utilize the measured value(s) to adjust the positioning of the mounts 225, 230. For example, the measured beam property may be iteratively compared to a desired beam property (e.g., one input or otherwise determined by a user, and/or one determined by one or more properties of the workpiece and/or the type of processing for which the laser is to be utilized), and the controller 250 may reduce or minimize the difference therebetween via, e.g., minimization of an error function. Other sensors may be utilized in addition or instead of light sensors in embodiments of the invention, e.g., thermal sensors and/or sensors measuring the effect of the beam on the workpiece surface (e.g., depth or profile sensors, etc.).

In various embodiments, the controller 250 may detect the beam shape, NA, spot size (or other beam property) resulting from various rotational angles of the mounts 225, 230, store the results, and utilize the results to determine one or more suitable settings in response to a desired beam property such as beam shape, spot size, or NA. The results may be utilized in a machine-learning model configured to predict one or more beam properties resulting from the rotational positions of the mounts 225, 230. In various embodiments, physical/optical modeling may be utilized to predict one or more beam properties (e.g., beam shape, spot size, and/or NA) resulting from various rotational positions of the mounts 225, 230, and such results may be utilized, at least in part, by the controller 250 to select these positions.

The controller 250 may, in accordance with the embodiments of the invention, control the NA, spot size, and/or beam shape of the output beam based on the type of desired processing (e.g., cutting, welding, etc.) and/or on one or more characteristics (e.g., materials parameters, thickness, material type, etc.) of the workpiece to be processed and/or of a desired processing path mapped out for the output beam. Such process and/or material parameters may be selected by a user from a stored database in a memory associated with the controller 250 or may be entered via an input device (e.g., touchscreen, keyboard, pointing device such as a computer mouse, etc.). One or more processing paths may be provided by a user and stored in an onboard or remote memory associated with the controller 250. After workpiece and/or processing path selection, the controller 250 queries the database to obtain the corresponding parameter values. The stored values may include a spot size, NA, and/or beam shape suitable to the material and/or to one or more processing paths or processing locations on the material. Embodiments of the invention may also incorporate aspects of the apparatus and techniques disclosed in U.S. patent application Ser. No. 14/639,401, filed on Mar. 5, 2015, U.S. patent application Ser. No. 15/261,096, filed on Sep. 9, 2016, and U.S. patent application Ser. No. 15/649,841, filed on Jul. 14, 2017, the entire disclosure of each of which is incorporated by reference herein.

Figure 3:
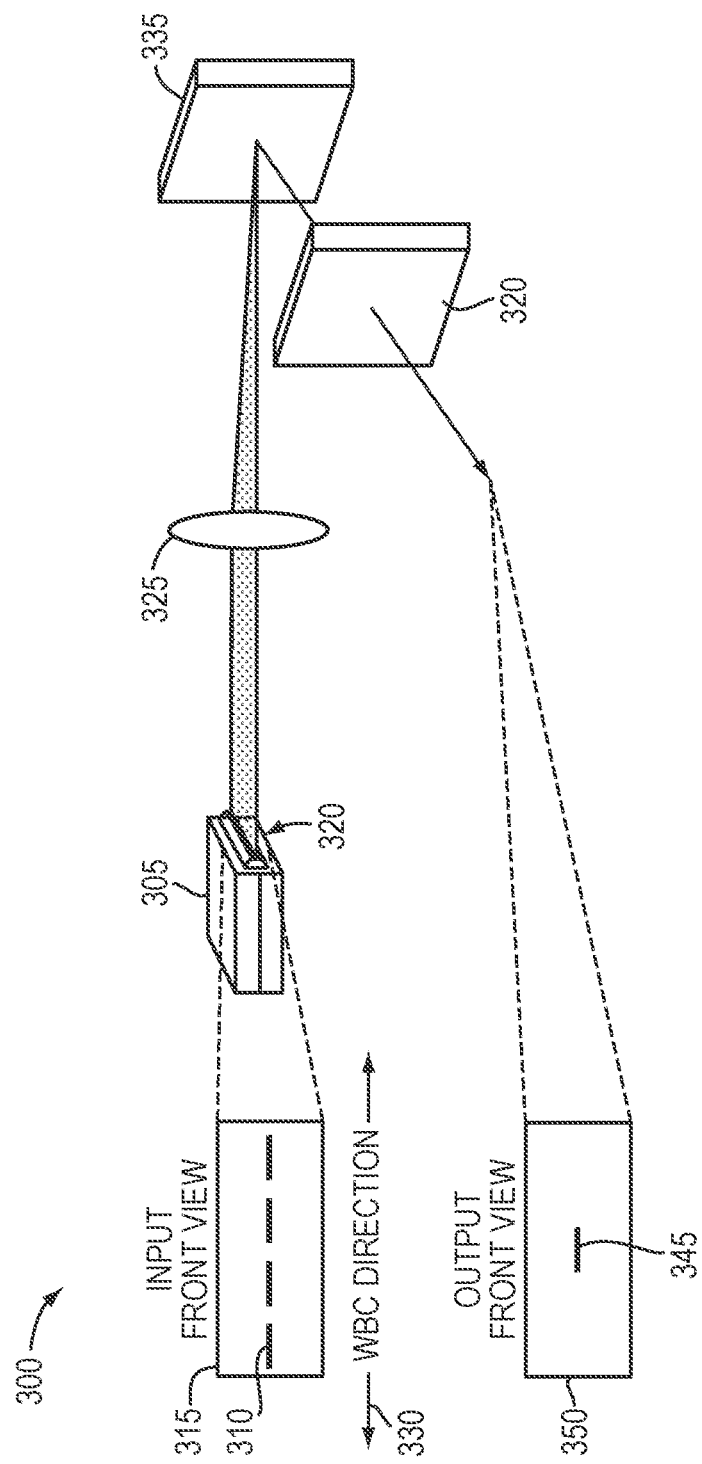
FIG. 3 is a schematic diagram of a wavelength beam combining technique that may be utilized to form laser beams within and/or utilizing laser resonator units in accordance with embodiments of the invention.

Laser systems and laser delivery systems in accordance with embodiments of the present invention and detailed herein may be utilized in and/or with WBC laser systems. Specifically, in various embodiments of the invention, multi-wavelength output beams of WBC laser systems may be utilized as the input beams for laser beam delivery systems (e.g., the output beams from emitter modules N) as detailed herein. FIG. 3 depicts an exemplary WBC laser system 300 that utilizes one or more lasers 305. In the example of FIG. 3, the laser 305 features a diode bar having four beam emitters emitting beams 310 (see magnified input view 315), but embodiments of the invention may utilize diode bars emitting any number of individual beams or two-dimensional arrays or stacks of diodes or diode bars. In the view 315, each beam 310 is indicated by a line, where the length or longer dimension of the line represents the slow diverging dimension of the beam, and the height or shorter dimension represents the fast diverging dimension. A collimation optic 320 may be used to collimate each beam 310 along the fast dimension. A transform optic(s) 325, which may include, consist essentially of, or consist of one or more cylindrical or spherical lenses and/or mirrors, are used to combine each beam 310 along a WBC direction 330. The transform optics 325 then overlap the combined beam onto a dispersive element 335 (which may include, consist essentially of, or consist of, e.g., a reflective or transmissive diffraction grating, a dispersive prism, a grism (prism/grating), a transmission grating, or an Echelle grating), and the combined beam is then transmitted as single output profile onto an output coupler 340. The output coupler 340 then transmits the combined beams 345 as shown in the output front view 350. The output coupler 340 is typically partially reflective and acts as a common front facet for all the laser elements in this external cavity system 300. An external cavity is a lasing system where the secondary mirror is displaced at a distance away from the emission aperture or facet of each laser emitter. In some embodiments, additional optics are placed between the emission aperture or facet and the output coupler or partially reflective surface. The output beam 345 is a thus a multiple-wavelength beam (combining the wavelengths of the individual beams 310), and may be utilized as the input beam in laser beam delivery systems detailed herein and/or may be coupled into an optical fiber. In various embodiments, WBC techniques in accordance with FIG. 3 may be performed within one or more of the emitter modules N themselves, and thus output coupler 320 may correspond to output coupler 220 depicted in FIG. 2. Various other components depicted in FIG. 3 may thus be present within emitter module N in accordance with embodiments of the present invention.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. For use with a laser system for combining a plurality of input beams into a combined output beam, an emitter module comprising:
    a housing having a forward face;
    disposed within the housing, a plurality of laser beam sources each configured to emit a laser beam;
    disposed within the housing, optics configured to combine the laser beams into a combined beam;
    disposed within the housing, an output coupler configured to (i) receive the combined beam, (ii) reflect a first portion of the combined beam back to the optics and thence to the plurality of laser beam sources, and (iii) transmit a second portion of the combined beam, from the forward face, as an input beam for the laser system; and
    means for removably but securely coupling the emitter module to the laser system,
    wherein the output coupler is rotatively adjustable about a pair of perpendicular coordinate axes parallel to the forward face.

2. The emitter module of claim 1, further comprising a refractive optic for receiving and directing the combined beam, wherein the refractive optic is rotatively adjustable about a pair of perpendicular coordinate axes parallel to the forward face.

3. The emitter module of claim 1, wherein the output coupler is rotatively adjustable on a tip/tilt mount.

4. The emitter module of claim 2, wherein the refractive optic is rotatively adjustable on a tip/tilt mount.

5. The emitter module of claim 2, wherein the combined beam passes through the refractive optic along a beam path, the beam path being adjustable about the perpendicular coordinate axes by a pair of mirrors.

6. A laser delivery system for directing optical radiation onto a workpiece, the system comprising:
    a plurality of emitter modules each having a housing having a forward face and producing an input beam, the emitter modules each comprising (a) disposed within the housing, a plurality of laser beam sources each configured to emit a laser beam, (b) disposed within the housing, emitter-module optics configured to combine the laser beams into a combined beam, and (c) disposed within the housing, an output coupler configured to (i) receive the combined beam, (ii) reflect a first portion of the combined beam back to the emitter-module optics and thence to the plurality of laser beam sources, and (iii) transmit a second portion of the combined beam, from the forward face, as the input beam;
    means for removably but securely coupling each of the emitter modules to the laser delivery system; and
    beam-combining optics for receiving the input beams from the emitter modules and producing an output beam therefrom,
    wherein in each of the emitter modules, the output coupler is rotatively adjustable about a pair of perpendicular coordinate axes parallel to the forward face of the housing of the emitter module.

7. The system of claim 6, wherein each emitter module further comprises a refractive optic for receiving and directing the combined beam.

8. The system of claim 7, wherein the refractive optic of each of the emitter modules is rotatively adjustable about the pair of perpendicular coordinate axes parallel to the forward face of the housing of the associated emitter module.

9. The system of claim 6, wherein the output coupler of each of the emitter modules is rotatively adjustable on a tip/tilt mount.

10. The system of claim 7, wherein the refractive optic of each of the emitter modules is rotatively adjustable on a tip/tilt mount.

11. The system of claim 7, wherein the combined beam of each emitter module passes through the associated refractive optic along a beam path, the beam path being adjustable about the perpendicular coordinate axes by a pair of mirrors.

12. The system of claim 7, further comprising a controller for adjusting an angular position of at least one of the refractive optic or the output coupler.

13. The system of claim 12, further comprising a sensor for sensing a parameter of the output beam, the controller being responsive to the sensor and adjusting, based on signals therefrom, the angular position of at least one of the refractive optic or the output coupler.

14. The system of claim 13, wherein the signals are indicative of at least one beam parameter.

15. The system of claim 14, wherein the at least one beam parameter is a beam shape, a spot size and/or a numerical aperture.

16. The system of claim 15, wherein the controller is configured to continue adjusting the angular position until a target value of the at least one beam parameter is attained.

17. The system of claim 6, wherein the emitter-module optics of each emitter module comprise:
focusing optics for focusing the laser beams onto a dispersive element; and
the dispersive element for receiving and dispersing the received focused beams, thereby forming the combined beam,
wherein the combined beam is composed of multiple wavelengths.

* * * * *